(12) United States Patent
Erhardt et al.

(10) Patent No.: US 7,208,382 B1
(45) Date of Patent: Apr. 24, 2007

(54) SEMICONDUCTOR DEVICE WITH HIGH CONDUCTIVITY REGION USING SHALLOW TRENCH

(75) Inventors: Jeffrey P. Erhardt, San Jose, CA (US); Kashmir S. Sahota, Fremont, CA (US); Emmanuil Lingunis, San Jose, CA (US); Nga-Ching Wong, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 705 days.

(21) Appl. No.: 10/151,595

(22) Filed: May 16, 2002

(51) Int. Cl.
*H01L 21/04* (2006.01)

(52) U.S. Cl. ............... 438/301; 438/561; 257/E21.056

(58) Field of Classification Search ............... 438/249, 438/301, 522, 532, 542, 554, 561, 564, 922; 257/296, 386
See application file for complete search history.

(56) References Cited

U.S. PATENT DOCUMENTS

| | | | | |
|---|---|---|---|---|
| 5,529,943 A | * | 6/1996 | Hong et al. ................. | 438/296 |
| 5,753,551 A | * | 5/1998 | Sung .......................... | 438/253 |
| 6,060,357 A | * | 5/2000 | Lee ............................ | 438/257 |
| 6,255,184 B1 | * | 7/2001 | Sune .......................... | 438/337 |
| 6,261,902 B1 | * | 7/2001 | Park et al. .................. | 438/257 |
| 6,274,449 B1 | * | 8/2001 | Vasanth et al. ............. | 438/305 |
| 6,509,241 B2 | * | 1/2003 | Park et al. .................. | 438/303 |
| 6,548,372 B1 | * | 4/2003 | Mouli ........................ | 438/424 |
| 6,555,866 B1 | * | 4/2003 | Kuo ........................... | 257/314 |
| 2001/0028075 A1 | * | 10/2001 | Chen et al. ................. | 257/296 |

* cited by examiner

*Primary Examiner*—Carl Whitehead, Jr.
*Assistant Examiner*—Jennifer M Dolan
(74) *Attorney, Agent, or Firm*—Mikio Ishimaru

(57) ABSTRACT

A method and structure is provided for an integrated circuit with a semiconductor substrate having an opening provided therein. A doped high conductivity region is formed from doped material in the opening and a diffused dopant region proximate the doped material in the opening. A structure is over the doped high conductivity region selected from a group consisting of a wordline, a gate, a dielectric layer, and a combination thereof.

14 Claims, 6 Drawing Sheets

SEMICONDUCTOR DEVICE WITH HIGH CONDUCTIVITY REGION USING SHALLOW TRENCH

BACKGROUND OF THE INVENTION

1. Technical Field

The present invention relates generally to semiconductor technology and more specifically to forming doped regions in semiconductor devices.

2. Background Art

Various types of semiconductor devices have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing multiple bits to be stored in a single cell is known as "MirrorBit®" Flash memory has been developed. In this technology, a memory cell is essentially split into two identical (mirrored) parts, each of which is formulated for storing one of two independent bits. Each MirrorBit Flash memory cell, like a traditional Flash cell, has a gate with a source and a drain. However, unlike a traditional Flash cell in which the source is always connected to an electrical source and the drain is always connected to an electrical drain, each MirrorBit Flash memory cell can have the connections of the source and drain reversed during operation to permit the storing of two bits.

The MirrorBit Flash memory cell has a semiconductor substrate with implanted conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer perpendicular to the bitlines. Programming circuitry controls two bits per cell by applying a signal to the wordline, which acts as a control gate, and changing bitline connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

One significant problem in semiconductor devices, such as memories and transistors, is that the implanted conductive regions have a relatively high resistivity. These high resistivity regions, such as bitlines and source/drain (S/D) junctions, are where dopants are implanted directly into the silicon substrate. The high resistivity results in higher power requirements, and subsequent heat generation with reduced life expectancy, for the semiconductor devices.

Another significant problem is that, during implantation of the bitlines and S/D junctions, the dopant is subject to a scattering effect, called "lateral straggle". The impact of the dopant on and in the silicon substrate causes the dopant ions to scatter at angles away from the direction of implantation so the ions do not end up directly in the implantation region. As a result, when bitlines and S/D junctions are annealed after implantation, the dopant diffuses over a wider region than desired. This severely limits how close together the bitlines and S/D junctions can be placed and, thus, how small the semiconductor device can be made.

A solution that would solve the above and other problems has been long sought but has long eluded those skilled in the art.

DISCLOSURE OF THE INVENTION

The present invention provides a method and structure for an integrated circuit with a semiconductor substrate having an opening provided therein. A doped high conductivity region is formed from doped material in the opening and a diffused dopant region proximate the doped material in the opening. A structure is over the doped high conductivity region selected from a group consisting of a wordline, a gate, a dielectric layer, and a combination thereof. Further steps complete the integrated circuit, which has doped high conductivity regions, which can be spaced very closely together.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
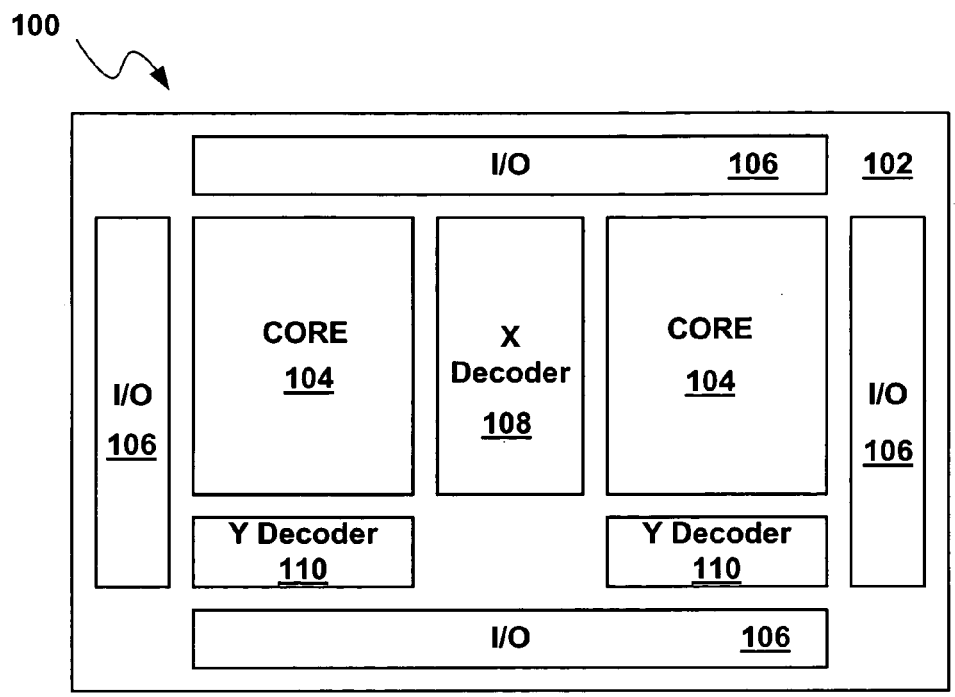
FIG. 1 is a plan view of a MirrorBit Flash EEPROM in accordance with the present invention.

Referring now to FIG. 1, therein is shown a plan view of a MirrorBit® Flash EEPROM 100 in accordance with the present invention. The EEPROM 100 includes a semiconductor substrate 102 in which one or more high-density core regions and one or more low-density peripheral portions are formed. High-density core regions include one or more M×N array cores 104 of individually addressable, substantially identical MirrorBit Flash memory cells. Low-density peripheral portions include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is defined as a plane parallel to the conventional plane or surface the semiconductor substrate 102 regardless of its orientation. The term "vertical" refers to a direction perpendicular to the horizontal as just defined. Terms, such as "on", "above", "below", "higher", "lower", "over", "under", "side", "sidewall", and "beside", are defined with respect to these horizontal and vertical planes. The term "processed" as used herein is defined to include one or more of the following: depositing or growing semiconductor materials, masking, patterning, photolithography, etching, implanting, removal, and/or stripping.

Figure 2:
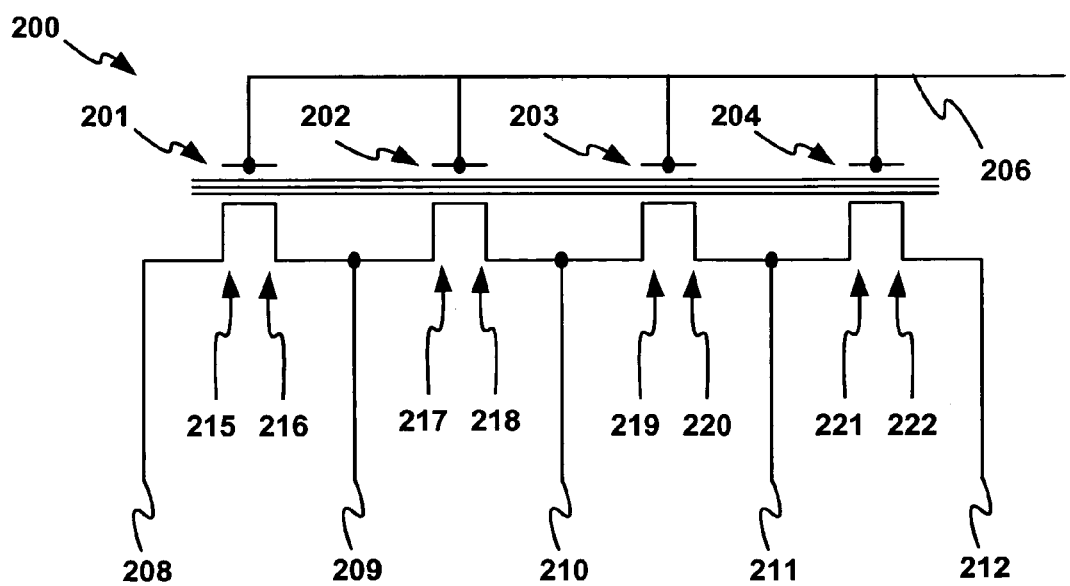
FIG. 2 is a circuit schematic of a portion of one of the M×N array cores of FIG. 1.

Referring now to FIG. 2, therein is shown a circuit schematic of a portion of one of the M×N array cores 104 of FIG. 1. The circuit schematic shows a line of memory cells 200, which includes memory cells 201 through 204 and which together can form an 8-bit word. Each of the memory cells 201 through 204 is connected to a wordline 206, which acts as a control gate. Each of the memory cells 201 through 204 has two associated bitlines with most of the memory cells having a common bitline. The memory cell 201 has associated bitlines 208 and 209; the memory cell 202 has associated bitlines 209 and 210; the memory cell 203 has associated bitlines 210 and 211; and the memory cell 204 has associated bitlines 211 and 212.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. Although adjacent memory cells share common bitlines, the adjacent memory cells do not interfere with each other because the memory cells are programmed one at a time and only one memory cell is active at a time while programming.

Figure 3:
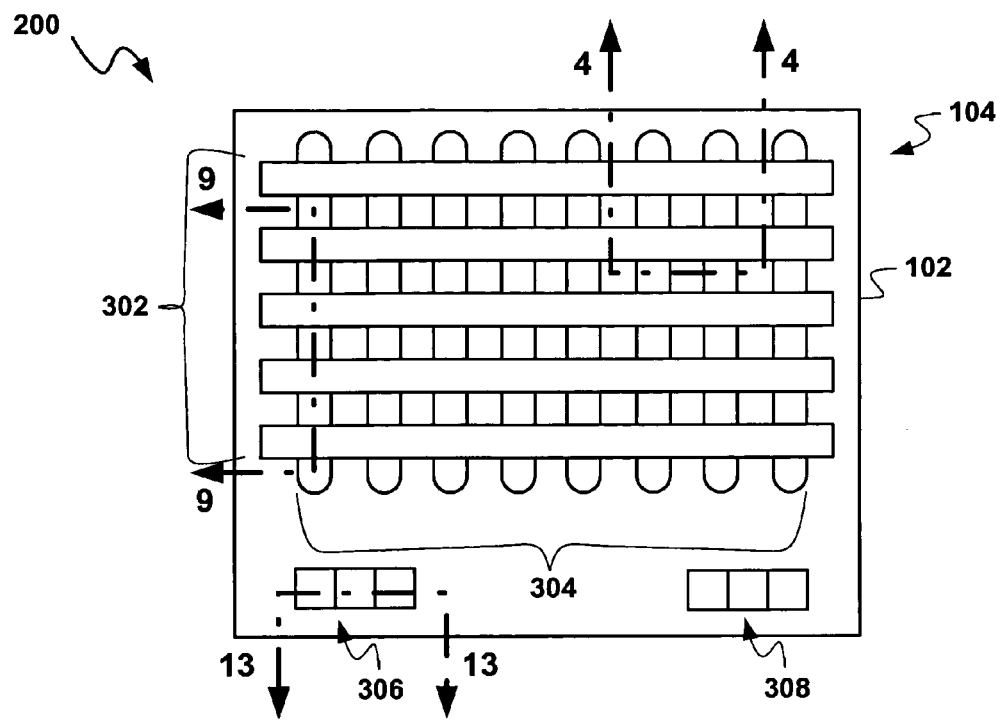
FIG. 3 is a plan view of a portion of one of the M×N array cores 104 of FIG. 1.

Referring now to FIG. 3, therein is shown a plan view of a portion of one of the M×N array cores 104 of FIG. 1. The semiconductor substrate 102 has a plurality of implanted bitlines 304 extending in parallel with a plurality of formed wordlines 302 extending in parallel and at right angles to the plurality of implanted bitlines 304. The wordlines 302 and bitlines 304 have contacts and interconnections (not shown) to the programming circuitry represented in part by x-decoders 108 and y-decoders 110 of FIG. 1 and transistors 306 and 308.

Figure 4:
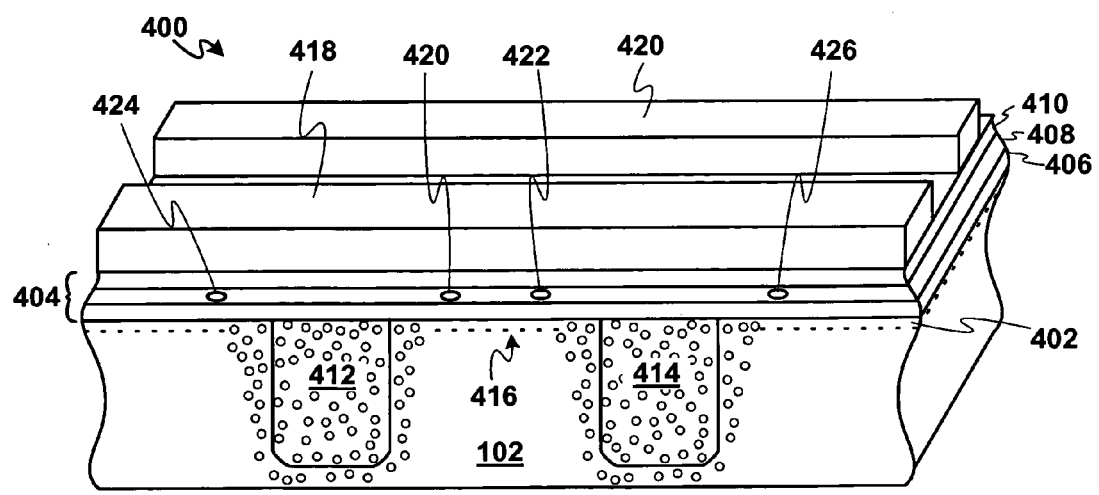
FIG. 4 is a cross-sectional isometric view of a typical MirrorBit Flash memory cell along the line 4—4 of FIG. 3.

Referring now to FIG. 4, therein is shown a cross-sectional isometric view of a MirrorBit Flash memory cell along the line 4—4 of FIG. 3, such as a memory cell 400. The semiconductor substrate 102 is a p-doped silicon substrate with a threshold adjustment implant 402 of a p-type material, such as boron. The threshold adjustment implant 402 provides a region that is more heavily doped than the semiconductor substrate 102 itself and assists in the control of the threshold voltage of the memory cell 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are of an oxide dielectric such as silicon dioxide ($SiO_2$) and the charge-trapping layer 408 is of a nitride dielectric such as silicon nitride (SiN). The oxide-nitride-oxide configuration is frequently referred to as a matter of convenience as an "ONO layer".

The bitlines 304 of FIG. 3 may be placed in or under the charge-trapping dielectric layer 404 in the semiconductor substrate 102 as typified by first and second doped high conductivity bitlines, or bitlines 412 and 414 according to the present invention. The bitlines 412 and 414 are spaced apart and define a volume between them with the threshold adjustment implant 402, which forms a channel 416.

A material, such as polysilicon, is deposited over the charge-trapping dielectric layer 404, patterned, etched, and stripped resulting in a wordline 418. The wordline 418 is one of the wordlines 302 in FIG. 3.

It is understood that the implementation of each step in manufacturing has associated processing steps including, but not limited to, patterning and masking, etching, depositing, implanting and/or stripping, all of which are commonly known to those having ordinary skill in the art.

For convenience, when looking at FIG. 4, the wordline 418 is also referred to as the "control gate" and the bitlines 412 and 414 are designated as "left" and "right" bitlines. When the bitlines 412 and 414 are respectively connected to drain and source, they are also respectively referred to as "drain" and "source" and, when the bitlines 412 and 414 are respectively connected to source and drain, they are also respectively referred to as "source" and "drain". While the bits in a memory cell are generally referred to as "first" and "complementary" bits, for ease of explanation herein, the separate bits are respectively designated as "left" and "right" bits herein, with each bitline having a left and right bit.

During programming of a right bit, such as the right bit 420 of the bitline 412, the bitline 412 is the drain and the bitline 414 is the source. When the wordline 418 is positively charged as the control gate, electrical fields are generated that cause hot electron injection from the drain bitline 412 into the channel 416 and towards the wordline 418. The negatively charged electrons gain the most energy at the drain so they pass through the first insulating layer 406 and into the charge-trapping layer 408 where they are trapped because they do not have enough energy to pass through the second insulating layer 410. These trapped electrons are a bit of information, which is the right bit 420. The right bit 420 can be detected during "reads" and remains until it is "erased" by a negative charge applied to the control gate.

Similarly, during programming of a left bit, such as the left bit 422 of the bitline 412, the bitline 414 is the drain and the bitline 412 is the source. When the wordline 418 is positively charged as the control gate, electrical fields are generated that cause hot electron injection from the drain bitline 414 into the channel 416 and towards the wordline 418. The negatively charged electrons gain the most energy at the drain so they pass through the first insulating layer 406 and into the charge-trapping layer 408 where they are trapped because they do not have enough energy to pass through the second insulating layer 410. These trapped electrons are a bit of information, which is the left bit 422. The left bit 422 can be detected during "reads" and remains until it is "erased" by a negative charge applied to the control gate.

Because the charge-tapping layer 408 is also a dielectric material, generally silicon nitride, the electrons do not move or migrate between right and left so the two bits are independent of each other. Further, the right bit is affected by the electrons coming from the right drain and the left bit is affected by the electrons from the left drain connection so the interchanging of the source and drain do not significantly affect the bit next to the source connection. Further, since the memory cell 400 is programmed individually, the source or drain connections will only effect bits 420 and 422; i.e., bits 424 and 426 would not be affected because the bitlines (not shown) to the left and right of bitlines 412 and 414 would not be connected to either source or drain.

Figure 5:
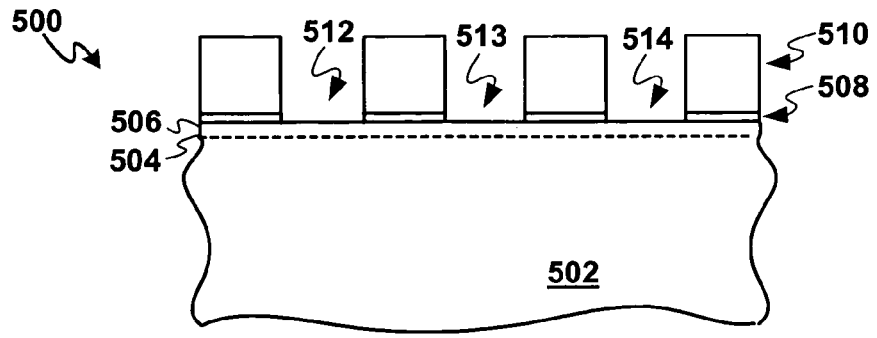
FIG. 5 is a substrate after the creation of a trench mask and optional anti-reflective coating (ARC) for bitlines.

Referring now to FIG. 5, therein is shown a partially processed memory device 500 having a silicon substrate 502, which is a p-doped silicon substrate with a threshold adjustment implant 503 of a p-type material, such as boron. The threshold adjustment implant 503 provides a region that is more heavily doped than the semiconductor substrate 502 itself and assists in the control of the threshold voltage of the memory device 500.

The silicon substrate 502 is shown after deposition of an optional anti-reflective coating layer 508 and a photoresist layer 510. The optional anti-reflective coating layer 508 and the photoresist layer 510 are photolithographically processed to form the openings 512–513.

Figure 6:
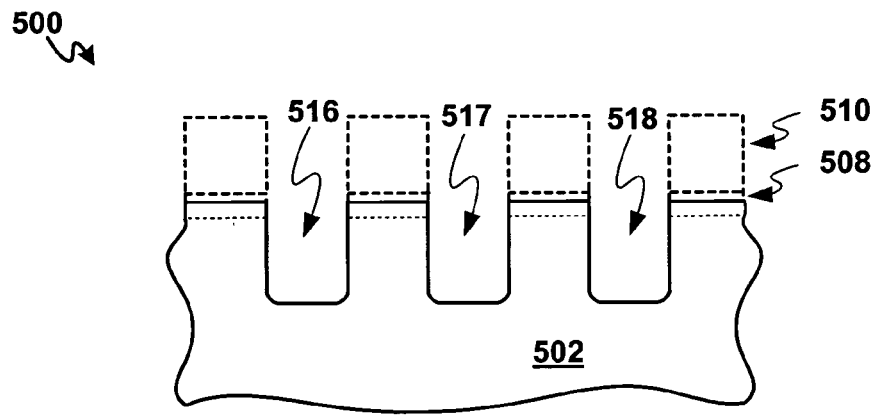
FIG. 6 is the structure of FIG. 5 after shallow trench opening etch.

Referring now to FIG. 6, therein is shown the partially processed memory device 500 of FIG. 5 after the optional anti-reflective coating layer 508 and the photoresist layer 510 are processed and used to form shallow trenches 516–518 into the silicon substrate 502. The method and depth for forming shallow trenches for shallow trench isolation is well-known in the art.

Figure 7:
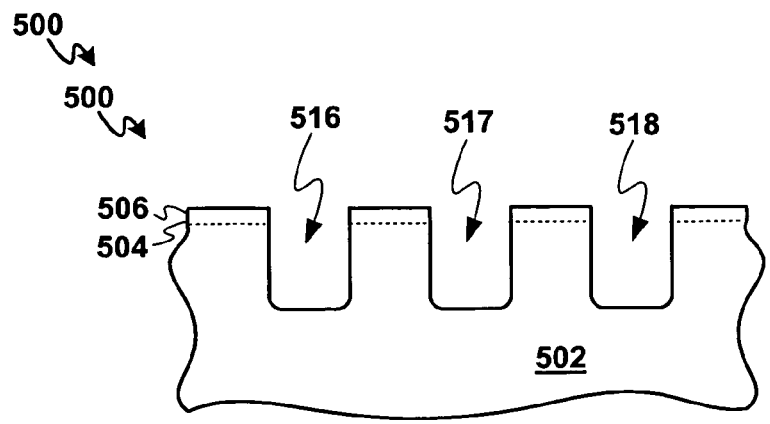
FIG. 7 is the structure of FIG. 6 after trench mask and ARC removal.

Referring now to FIG. 7, therein is shown the partially processed memory device 500 of FIG. 6 after a stripping process removes the optional anti-reflective coating layer 508 and the photoresist layer 510.

Figure 8:
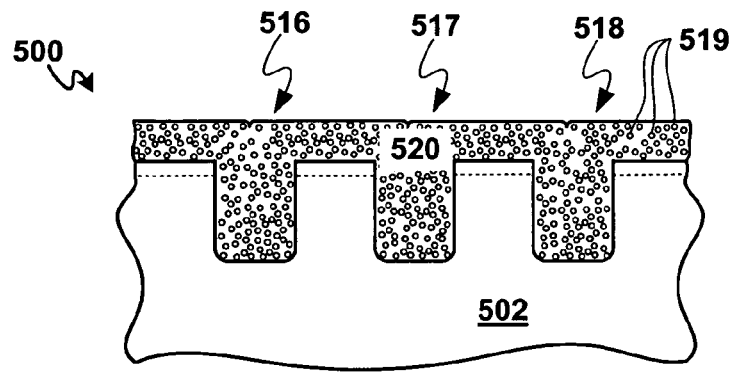
FIG. 8 is the structure of FIG. 7 after deposition of a doped polysilicon layer.

Referring now to FIG. 8, therein is shown the partially processed memory device 500 of FIG. 7 after deposition of a layer of dopant 519 containing doped high conductivity bitline material 520, such as doped polysilicon, over the silicon substrate 502 and entirely filling the shallow trenches 516–518. In one embodiment, where the silicon substrate 502 is p-doped, the doping of the doped high conductivity bitline material 520 will be n-doped.

Figure 9:
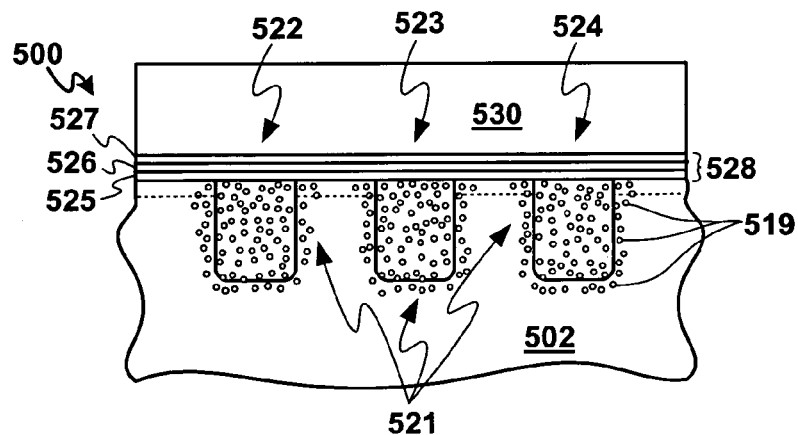
FIG. 9 is a cross-sectional view of a Flash memory cell similar to a cross-sectional view along line 9—9 in FIG. 3 after planarization, charge-trapping dielectric layer deposition, thermal anneal processes, and wordline formation.

Referring now to FIG. 9, therein is shown the partially processed memory device 500 of FIG. 8 after the layer of doped high conductivity bitline material 520 is planarized by a planarization technique, such as chemical-mechanical polishing (CMP) process. The result is a planar surface with the doped high conductivity material inlaid in the shallow trenches 516–518.

To form high conductivity bitlines, a thermal annealing process is used to diffuse dopant 519 from the doped high conductivity material 520 into dopant diffused regions 521 in the silicon substrate 502 to provide required electrons in the same fashion as implanted bitlines. This process creates the doped high conductivity bitlines 522–524.

It should be noted that the doped high conductivity bitlines 522–524 or doped high conductivity regions, are formed from the combination of high conductivity polysilicon and outdiffused dopant in the semiconductor substrate 502. These doped high conductivity bitlines 522–524 have a lower resistivity and higher conductivity when compared to the implanted prior art counterparts. The terms "high conductivity material" and high conductivity bitline" respectively define a material of higher conductivity than doped silicon and a bitline with a conductivity higher than that of an implanted bitline in which a dopant is implanted into silicon and used alone as the conductive line.

The spacing of the trench-filled bitlines can be very close together since the masking process can easily and extremely tightly control the trench locations. The degree of diffusion of the doping can be controlled by time and temperature so as to as to have the dopant closer than prior art implanted bitlines.

During implantation of the bitlines in the prior art, the dopant was subject to a scattering effect, called "lateral straggle". The impact of the dopant on and in the silicon substrate caused the dopant ions to scatter at angles away from the direction of implantation so the ions did not end up directly in the implantation region. As a result, when the implanted bitlines are annealed, the dopant diffuses over a wider region than desired. This lateral straggle is one factor that severely limits how closely the bitlines can be placed and, thus, how small the semiconductor device can be made.

Also, during implantation of the bitlines in the prior art, the implantation of the dopants caused damage to the lattice structure of the silicon substrate itself. The damage is in the form of voids referred to as "point defects". The point defects are responsible for "transient enhanced diffusion", which is an effect where dopants diffuse over a much greater distance than would be predicted based on the thermal cycle. This transient enhanced diffusion is another factor, which severely limits how closely the bitlines can be placed and, thus, how small the semiconductor device can be made.

In the present invention, it has been discovered that the non-implanted bitlines can unexpectedly reduce by 50% and more the amount of lateral spread of dopant over the amount of lateral spread of dopant of implanted bitlines from the center of implantation. This means that the non-implanted bitlines can be placed within the lateral straggle or transient enhanced diffusion shorting distances of each other; i.e., the distances within which implanted bitlines would be shorted circuited together.

In the present invention, it has also been discovered that the conductivity of bitline can be decoupled from the amount of dopant placed in the semiconductor junction itself. By controlling the thermal cycle, the amount of dopant released into the semiconductor junction can be controlled. In the past, to provide higher conductivity bitlines, more dopant was required which resulted in an undesirable accompanying amount of dopant provided into the semiconductor junction.

Thereafter, a first insulating layer 525, a charge-trapping layer 526, and a second insulating layer 527 are deposited to form a charge-trapping dielectric layer 528. Subsequently, a semiconductor structure, such as a wordline 530, is formed to substantially complete the Flash memory device 500. The combination of the first, charge-trapping, and second insulating layers 525, 526, and 527 can form the charge-trapping dielectric layer 528 to be of oxide, nitride, and oxide or ONO layer of the memory device 500.

It will be understood that the memory device 500 could also be made by forming the high conductivity bitlines 522–524 after depositing the charge-trapping dielectric layer 528 over the high conductivity bitlines 522–524 and using the CMP process to form the high conductivity bitlines 522–524 in the charge-trapping dielectric layer 528.

Figure 10:
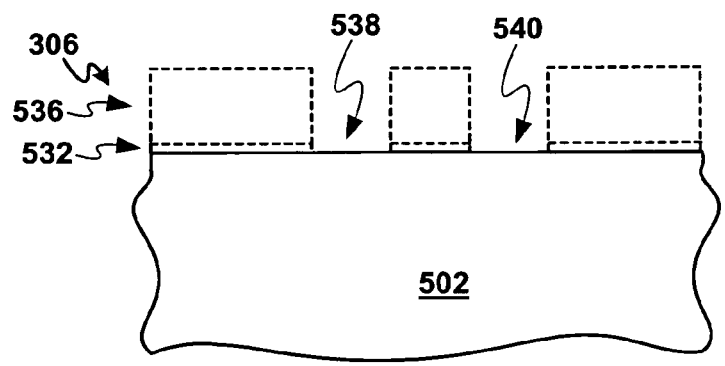
FIG. 10 is similar to the structure of FIG. 5 after creation of a trench mask and optional ARC for a transistor.

Referring now to FIG. 10, therein is shown the partially processed transistor 306 of FIG. 3 with the silicon substrate 502 not having a threshold adjustment implant and after an optional anti-reflective coating layer 532 and a photoresist layer 536 are processed to form S/D openings 538 and 540 therein.

Figure 11:
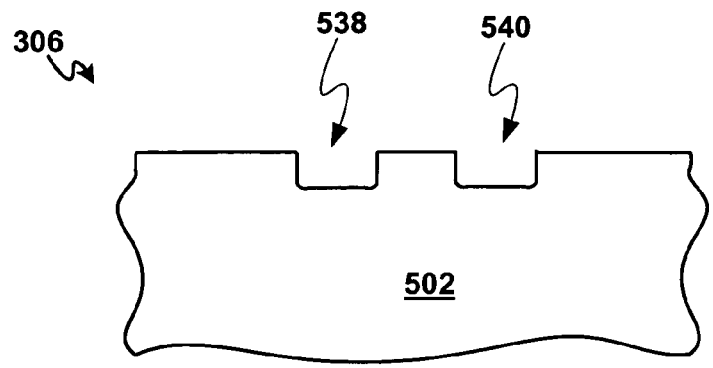
FIG. 11 after shallow trench opening etch, and trench mask and ARC removal.

Referring now to FIG. 11, therein is shown the partially processed transistor 306 of FIG. 10 and a stripping process has removed the patterned optional anti-reflective coating layer 532 and the patterned photoresist layer 536.

Figure 12:
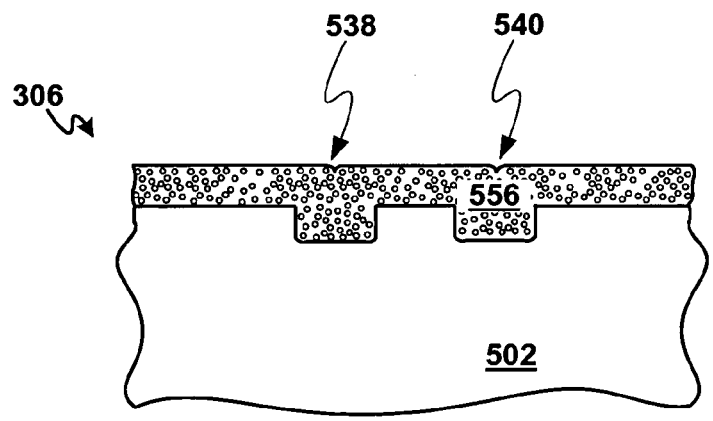
FIG. 12 is the structure of FIG. 9 after deposition of a doped polysilicon layer.

Referring now to FIG. 12, therein is shown the partially processed transistor 306 of FIG. 11 after deposition of a layer of doped high conductivity source/drain (S/D) material 556, such as doped polysilicon, over the silicon substrate 502 and in the shallow trenches 550 and 552. In one embodiment, where the silicon substrate 502 is p-doped, the doping of the doped high conductivity source/drain (S/D) material 556 will be n-doped.

Figure 13:
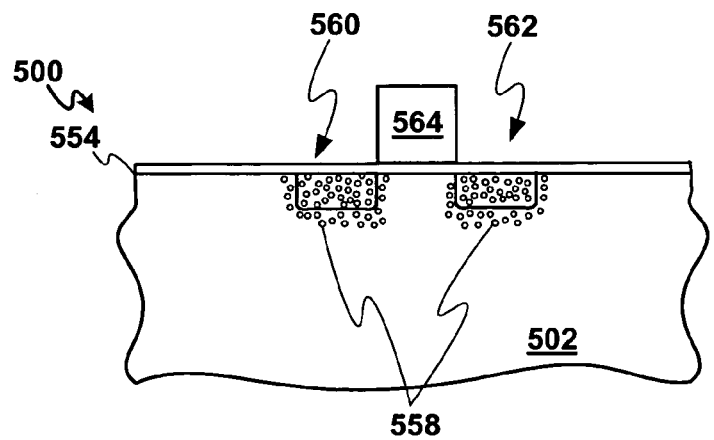
FIG. 13 is a cross-sectional view of a transistor similar to a cross-sectional view along line 13—13 in FIG. 3 after planarization, gate dielectric deposition, thermal anneal processes, and gate formation.

Referring now to FIG. 13, therein is shown the partially processed transistor 306 of FIG. 12 after the layer of doped high conductivity source/drain (S/D) material 556 is planarized by a planarization technique, such as chemical-mechanical polishing (CMP) process. The result is a planar surface with the doped high conductivity material inlaid in the shallow trenches 550 and 552.

To form high conductivity source/drain (S/D) junctions, a thermal annealing process is used to diffuse dopant 558 from the doped high conductivity (S/D) material 556 into the silicon substrate 502 to provide required electrons in the same fashion as implanted bitlines. This process creates the high conductivity source/drain (S/D) junctions 560 and 562.

It should be noted that the high conductivity source/drain (S/D) junctions 560 and 562 are formed from the combination of high conductivity polysilicon and out diffused dopant into the semiconductor substrate 502. These filled-trench S/D junctions have a lower resistivity and higher conductivity when compared to their implanted prior art counterparts. The term "high conductivity S/D junction" defines a S/D junction with a conductivity higher than that of a S/D junction in which a dopant is implanted into silicon and used alone as a conductive junction.

The spacing of the trench-filled S/D junction can be very close together since the masking process can easily and extremely tightly control the trench locations. The degree of diffusion of the doping can be controlled by time and temperature so as to as to have the dopant proximate to or very close to the implanted bitlines to allow them to be much closer together.

The S/D junctions in the present invention can be placed closer together than the "lateral straggle shorting distance", which is defined as the distance at which lateral straggle of comparably doped S/D junctions will short-circuit together.

Thereafter, a first insulating layer 554, a gate oxide, is deposited and a semiconductor structure, such as a gate 564, is formed to substantially complete the transistor 306 of the Flash memory device 500. Conventional steps are then used to complete the memory device 500 and the transistor 306 as part of an integrated circuit.

Figure 14:
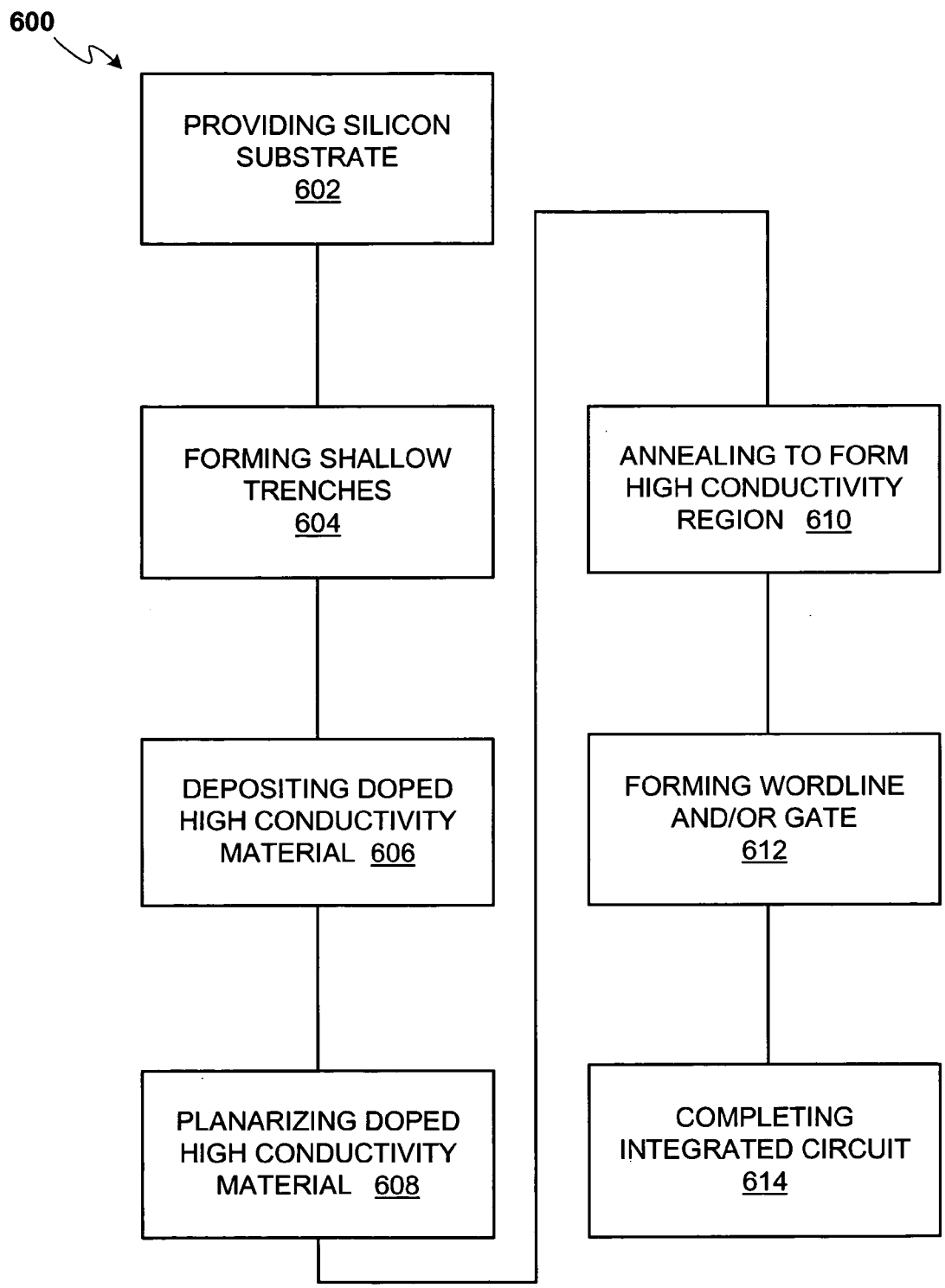
FIG. 14 is shown a simplified process chart of the present invention.

Referring now to FIG. 14, therein is shown a simplified process chart 600 of the present invention which includes: providing semiconductor substrate 602; forming shallow trenches 604; depositing doped high conductivity material 606; planarizing doped high conductivity material 608; annealing to form high conductivity region 610; forming wordline and/or gate 612; and completing integrated circuit 614.

Various implementations of dual bit memory cell and other semiconductor device architecture may be achieved according to one or more aspects of the present invention. In particular, the invention is applicable to memory devices wherein both bits in a dual bit cell are used for data or information storage. Further, the present invention is applicable for creating doped high conductivity regions for other purposes such as source junctions, drain junctions, interconnects, and a combination thereof.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of manufacturing an integrated circuit comprising:
    forming an opening in a semiconductor substrate;
    depositing doped material in the opening;
    forming a first doped high conductivity region from the doped material wherein forming the first doped high conductivity region reduces the lateral spread of dopant by 50% and more over the lateral spread of dopant of an implanted conductive region; and
    forming a semiconductor structure over the doped high conductivity region.

2. The method of manufacturing an integrated circuit as claimed in claim 1 wherein forming the first doped high conductivity region includes thermal annealing to cause dopant diffusion from the doped material into the semiconductor substrate.

3. The method of manufacturing an integrated circuit as claimed in claim 1 wherein forming the first doped high conductivity region forms a region selected from a group consisting of bitlines, source junctions, drain junctions, interconnects, and a combination thereof.

4. The method of manufacturing an integrated circuit as claimed in claim 1 including forming a second doped high conductivity region within lateral straggle shorting distance of the first doped high conductivity region.

5. The method of manufacturing an integrated circuit as claimed in claim 1 including forming a second doped high conductivity regions within transient enhanced diffusion shorting distance of the first doped high conductivity region.

6. The method of manufacturing an integrated circuit as claimed in claim 1 wherein forming the first doped high conductivity region includes changing the conductivity of the doped material without changing the doping of the first doped high conductivity region.

7. The method of manufacturing an integrated circuit as claimed in claim 1 including:
    depositing a first insulating layer over the semiconductor substrate;
    depositing a charge-trapping layer over the first insulating layer; and
    depositing a second insulating layer over the charge-trapping layer.

8. A method of manufacturing an integrated circuit comprising:
    providing a silicon substrate;
    forming shallow trenches in the silicon substrate;
    depositing doped polysilicon material in the shallow trenches;
    planarizing the doped polysilicon material in the shallow trenches;
    forming doped high conductivity regions from the planarized doped polysilicon material wherein forming the doped high conductivity regions reduces the lateral spread of dopant by 50% and more over the lateral spread of dopant of an implanted conductive region;
    depositing a first insulating layer over the silicon substrate and the doped polysilicon material;
    forming structures over the insulating layer, the structures selected from a group consisting of wordlines, gates, dielectric layers, and a combination thereof; and
    completing the integrated circuit.

9. The method of manufacturing an integrated circuit as claimed in claim 8 wherein forming the doped high conductivity regions includes thermal annealing to cause dopant diffusion from the doped polysilicon material into the semiconductor substrate.

10. The method of manufacturing an integrated circuit as claimed in claim 8 wherein forming the doped high conductivity regions forms regions selected from a group consisting of bitlines, source junctions, drain junctions, interconnects, and a combination thereof.

11. The method of manufacturing an integrated circuit as claimed in claim 8 wherein the doped high conductivity regions are within lateral straggle shorting distance of each other.

12. The method of manufacturing an integrated circuit as claimed in claim 8 wherein the doped high conductivity regions are within transient enhanced diffusion shorting distance of each other.

13. The method of manufacturing an integrated circuit as claimed in claim 8 wherein forming the doped high conductivity region includes changing the conductivity of the doped material without changing the doping of the doped high conductivity region and includes changing the doping of the doped material without changing the conductivity of the doped high conductivity region.

14. The method of manufacturing an integrated circuit as claimed in claim 8 wherein:
    depositing the first insulating layer deposits an oxide; and
    including:
    depositing a nitride charge-trapping layer over the first insulating layer; and
    depositing an oxide second insulating layer over the nitride charge-trapping layer.

* * * * *